United States Patent
Namikawa et al.

(10) Patent No.: US 8,460,783 B2
(45) Date of Patent: *Jun. 11, 2013

(54) CLEANING SHEETS, TRANSFER MEMBER HAVING CLEANING FUNCTION, AND METHOD OF CLEANING SUBSTRATE-PROCESSING APPARATUS WITH THESE

(75) Inventors: Makoto Namikawa, Ibaraki (JP); Yoshio Terada, Ibaraki (JP); Jirou Nukaga, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 370 days.

This patent is subject to a terminal disclaimer.

(21) Appl. No.: 12/045,326

(22) Filed: Mar. 10, 2008

(65) Prior Publication Data

US 2008/0173329 A1    Jul. 24, 2008

Related U.S. Application Data

(60) Division of application No. 11/000,007, filed on Dec. 1, 2004, now abandoned, which is a continuation-in-part of application No. PCT/JP02/06118, filed on Jun. 19, 2002.

(51) Int. Cl.
*B32B 3/26* (2006.01)
*B32B 7/12* (2006.01)
*B32B 9/04* (2006.01)

(52) U.S. Cl.
USPC .................... 428/304.4; 428/317.1; 428/343; 428/411.1

(58) Field of Classification Search
USPC .......................... 428/304.4, 317.1, 343, 411.1
See application file for complete search history.

(56) References Cited

U.S. PATENT DOCUMENTS

| | | | |
|---|---|---|---|
| 2,383,839 | A | 8/1945 | Beekley, Jr. |
| 3,149,364 | A | 9/1964 | Baptist et al. |
| 5,415,889 | A | 5/1995 | Uchida et al. |
| 5,427,644 | A | 6/1995 | Nagatsuka et al. |
| 5,806,137 | A | 9/1998 | Ishi et al. |
| 5,853,633 | A | 12/1998 | Kono et al. |
| 5,902,678 | A | 5/1999 | Konda et al. |
| 6,055,392 | A | 4/2000 | Huver et al. |
| 6,126,772 | A | 10/2000 | Yamamoto et al. |
| 6,170,115 | B1 | 1/2001 | Tanaka et al. |
| 6,248,857 | B1 | 6/2001 | Misumi et al. |
| 6,663,306 | B2 | 12/2003 | Policicchio et al. |
| 6,741,086 | B2 | 5/2004 | Maekawa et al. |
| 6,845,225 | B2 | 1/2005 | Toyoda et al. |

FOREIGN PATENT DOCUMENTS

| | | |
|---|---|---|
| DE | 298 05 040 U1 | 6/1998 |
| DE | 197 02 546 C1 | 7/1998 |
| EP | 0 416 645 A2 | 3/1991 |
| EP | 0 658 828 A1 | 6/1995 |
| EP | 0 930 538 A1 | 7/1999 |
| JP | 58-50435 U | 4/1983 |
| JP | 61-138253 A | 6/1986 |
| JP | 2-091241 A | 3/1990 |
| JP | 53-26471 | 12/1993 |
| JP | 6-173041 A | 6/1994 |
| JP | 6-274072 | 9/1994 |
| JP | 7-41737 A | 2/1995 |
| JP | 7-065362 | 3/1995 |
| JP | 07-128368 | 5/1995 |
| JP | 7-142440 A | 6/1995 |
| JP | 7-236863 A | 9/1995 |
| JP | 08-085070 A | 4/1996 |
| JP | 8-115896 A | 5/1996 |
| JP | 8-115897 | 5/1996 |
| JP | 8-124892 A | 5/1996 |
| JP | 8-139067 A | 5/1996 |
| JP | 8-181158 | 7/1996 |
| JP | 8-323572 | 12/1996 |
| JP | 9-028645 A | 2/1997 |
| JP | 10-129078 A | 5/1998 |
| JP | 10-154686 | 6/1998 |
| JP | 110-043656 A | 2/1999 |
| JP | 11-87458 A | 3/1999 |
| JP | 11-224895 A | 8/1999 |
| JP | 11-228994 A | 8/1999 |
| JP | 11-269436 A | 10/1999 |
| JP | 2000-109530 A | 4/2000 |
| JP | 2000-128945 A | 5/2000 |
| JP | 2000-288482 A | 10/2000 |
| JP | 2000-312862 | 11/2000 |
| JP | 2001-181962 A | 7/2001 |
| JP | 2001-198540 A | 7/2001 |
| JP | 2001-264975 A | 9/2001 |
| JP | 2002-033251 A | 1/2002 |
| JP | 2002-79190 A | 3/2002 |
| JP | 2002-249749 A | 9/2002 |
| JP | 2003-68810 A | 3/2003 |
| JP | 2003-115521 | 4/2003 |
| KR | 0073655 | 4/1991 |
| KR | 2003-0016420 | 2/2003 |
| WO | WO 97/00534 | 1/1997 |
| WO | WO 02/094508 | 11/2002 |

OTHER PUBLICATIONS

Notifications of Reasons for Refusal issued in Japanese Application No. 2000-177964 dated Feb. 9, 2010.
Kunststoff-Kompendium, Adolf Franz, Karlheinz Biederbick, First Edition, Vogel-Buchverlag Würzbug 1984, p. 292.
Japanese Office Action dated Apr. 5, 2005.
Japanese Office Action dated Mar. 6, 2007.
Japanese Notification of Reason for Refusal dated Mar. 10, 2009.
Japanese Notification of Reasons for Refusal dated May 26, 2009.

(Continued)

*Primary Examiner* — Victor Chang

(74) *Attorney, Agent, or Firm* — Sughrue Mion, PLLC

(57) ABSTRACT

A cleaning sheet which comprises a porous layer as a cleaning layer; or a cleaning sheet which comprises a sheet material having a porous layer and, formed on one side of the sheet material, an adhesive layer.

11 Claims, No Drawings

OTHER PUBLICATIONS

Japanese Notification of Reasons for Refusal dated Jul. 7, 2009.
Japanese Notification of Reasons for Refusal dated Jul. 14, 2009.
Japanese Notification of Reasons for Refusal dated Jun. 30, 2009.
Japanese Notification of Reasons for Refusal dated Nov. 10, 2009.
US Office Action, dated Oct. 8, 2010, issued in U.S. Appl. No. 11/643,774.
US Office Action, dated Nov. 19, 2010, issued in U.S. Appl. No. 12/851,797.
US Office Action, dated Jan. 31, 2011, issued in U.S. Appl. No. 11/643,774.
Machine translation of JP 2002-033251.
US Office Action, dated May 18, 2011, issued in U.S. Appl. No. 12/851,797.
U.S. Office Action, dated Oct. 7, 2011, issued in U.S. Appl. No. 11/643,774.
Non-Final Office Action dated Jun. 21, 2011, in U.S. Appl. No. 11/643,774.
Examiner's Answer dated Apr. 30, 2012 issued by the US Patent and Trademark Office in U.S. Appl. No. 11/643,774.

CLEANING SHEETS, TRANSFER MEMBER HAVING CLEANING FUNCTION, AND METHOD OF CLEANING SUBSTRATE-PROCESSING APPARATUS WITH THESE

This is a divisional of application Ser. No. 11/000,007 filed Dec. 12, 2004, which is a continuation-in-part application of International Application PCT/JP02/06118 filed Jun. 19, 2002. The entire disclosures of the prior applications, application Ser. No. 11/000,007 is considered part of the disclosure of the accompanying divisional application and is hereby incorporated by reference.

TECHNICAL FIELD

The present invention relates to sheets for cleaning various substrate-processing apparatus, a transfer member having a cleaning function, and a method of cleaning a substrate-processing apparatus with these. More particularly, the invention relates to cleaning sheets, a transfer member having a cleaning function, and a cleaning method for substrate-processing apparatus which should be kept away from particles, such as, e.g., apparatus for producing or inspecting semiconductors, flat panel displays, printed wiring boards, or the like.

BACKGROUND OF THE INVENTION

In various substrate-processing apparatus, substrates are conveyed while being in physical contact with each conveying system. In case where a substrate being conveyed or the conveying systems have particles adherent thereto, the succeeding substrates are contaminated one after another. It has hence been necessary to periodically stop and clean the apparatus. Because of this, there has been a problem that the cleaning operation results in a reduced time efficiency and necessitates much labor. In order to eliminate such problems, a technique for removing particles adherent to inner parts of a substrate-processing apparatus by conveying a substrate having a pressure-sensitive adhesive substance bonded thereto (e.g., Japanese Patent Laid-Open No. 154686/1998) and a technique for removing particles adherent to the back side of substrates by conveying a platy member (Japanese Patent Laid-Open No. 87458/1999) have been proposed.

The technique for removing particles adherent to inner parts of a substrate-processing apparatus by conveying a substrate having a pressure-sensitive adhesive substance bonded thereto is an effective method for eliminating the problem described above. However, there is a possibility in this technique that the pressure-sensitive adhesive substance might adhere too tenaciously to a contact part of the apparatus to be separated therefrom. Namely, this technique has a possibility that the substrate cannot be conveyed without fail or might damage the conveying device. This problem is severe especially in apparatus having a chuck table employing a vacuum holding mechanism.

In the case where a pressure-sensitive adhesive substance is used as a cleaning layer, the surface of the pressure-sensitive adhesive substance is generally protected with a release film coated with a release agent such as a silicone. However, the technique described above has a problem that components of the release agent migrate/transfer to the surface of the cleaning layer and the release agent components which have migrated contaminate the substrate contact part of the conveying device.

Furthermore, the technique for removing particles by conveying a platy member has a problem that it is inferior in dust-removing ability, which is important, although conveyance can be conducted without arousing any trouble.

In view of such circumstances, an aim of the invention is to provide cleaning sheets and a transfer member having a cleaning function which each can be conveyed into a substrate-processing apparatus without fail and with which particles adherent to inner parts of the apparatus can be easily removed without fail.

DISCLOSURE OF THE INVENTION

The present inventors made intensive investigations in order to accomplish the aim. As a result, it has been found that when a sheet having a cleaning layer or a transfer member, e.g., a substrate, having the sheet bonded thereto is conveyed so as to remove particles adherent to inner parts of a substrate-processing apparatus, then use of a sheet having porosity (porous sheet) as the cleaning layer is effective in easily separating and removing the particles without fail without posing any of the problems described above. The invention has thus been completed.

The invention relates to: a cleaning sheet which comprises a layer having porosity (porous layer) as a cleaning layer (embodiment 1); a cleaning sheet which comprises a sheet material having a porous layer and, formed on one side of the sheet material, a pressure-sensitive adhesive layer (embodiment 2); a cleaning sheet which comprises a base material and a porous layer formed as a cleaning layer on one side of the base material (embodiment 3); a cleaning sheet which comprises a base material, a porous layer formed as a cleaning layer on one side of the base material, and a pressure-sensitive adhesive layer formed on the other side of the base material (embodiment 4); the cleaning sheets characterized in that the porous layer has substantially no tackiness (embodiment 5); the cleaning sheets characterized in that the porous layer is a porous film of ultrahigh-molecular weight polyethylene (embodiment 6); the transfer member having a cleaning function, which comprises a transfer member and a porous layer formed as a cleaning layer on one side of the transfer member, and others.

BEST MODE FOR CARRYING OUT OF THE INVENTION

The cleaning layer in the cleaning sheet of the invention (hereinafter, the cleaning layer may be in the form of a cleaning sheet itself, a multilayered sheet, a sheet laminated to a base material, etc.) is a layer which is porous and has substantially no tackiness.

By using a cleaning layer designed to be porous and substantially no tackiness in the invention, particles of various sizes can be caught and removed with the porous cleaning layer without fail while preventing the particles from shedding off and without arousing a conveyance trouble.

The cleaning layer in the invention, which is porous, is preferably as follows. Although the shape and size of the pores are not particularly limited, too high a proportion of pores larger than the sizes of particles may result in a decrease in the effect of catching particles. For example, in the case of particles having a size of about from 1 to 10 µm, it is usually preferred to use a porous film having an average pore diameter as small as from 0.1 to 100 µm. The porosity thereof is preferably about from 30 to 95%, especially about from 40 to 90%.

The cleaning layer preferably has a tackiness of 0.05 N/10 mm or lower in terms of the strength of 180° peeling from a silicon wafer as determined by applying the cleaning layer in a width of 10 mm to the mirror surface of the silicon wafer and measuring the 180° peel strength in accordance with JIS Z0237. As long as the peel strength of the cleaning layer is not higher than this value, the cleaning layer can be regarded as substantially free from tackiness in the invention.

This cleaning layer is not particularly limited in material, constitution, etc., as long as it is porous and preferably substantially no tackiness. From the standpoint of contamination prevention, however, examples of the material include various plastic materials such as polyethylene, polypropylene, polyesters, and polyurethanes. Preferable materials for the cleaning layer are heat-resistant polymeric resins such as a polycarbodiimide, polyimide, heat-resistant acrylic resin, fluororesin, polyester resin. In particular, polycarbodiimides are suitable for use as the cleaning layer in the invention because they do not generate a volatile gas or decomposition monomer even when exposed to high temperatures of 400° C. or above. Of these, the polycarbodiimide having a structural unit represented by the following formula (1):

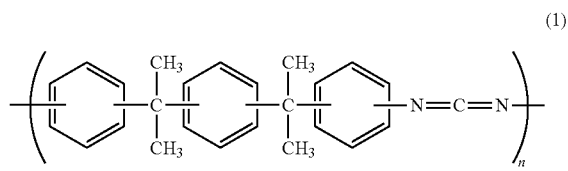

(1)

(wherein n is an integer of 2 to 300),
which is described in Japanese patent application No. 10-305201, is especially more suitable for use as the cleaning layer in the invention because it has high heat resistance (Tg of 200° C. or higher) and is excellent also in adhesiveness, low-temperature processability, and moisture resistance. However, the invention should not be construed as being limited to cleaning sheets employing a carbodiimide resin having that structure.

Although the thickness of the cleaning layer is not particularly limited, it is generally about from 5 to 500 μm, preferably from 10 to 100 μm.

In the invention, the porous layer serving as a cleaning layer is especially preferably a porous film of ultrahigh-molecular weight polyethylene (usually having a molecular weight of 500,000 or higher). This film not only has high flexibility and surface smoothness comparable to that of mirror surfaces but also has an even porous structure. Because of this, particles come into highly close contact with the cleaning layer and wholly or partly come into pores of the layer. The cleaning sheet has the effect of thus catching particles without fail. In addition, since this cleaning layer has substantially no tackiness, it does not tenaciously adhere to the contact part of the apparatus when the cleaning sheet or the transfer member which will be described later is conveyed. Namely, the invention has an effect that a cleaning sheet or the like capable of being conveyed without fail can be provided.

As the porous film of ultrahigh-molecular weight polyethylene can be used a commercial product such as, e.g., trade name Solupor, manufactured by Teijin Ltd., or trade name Sunmap, manufactured by Nitto Denko Corp.

It is desirable that a removable sheet having slight tackiness be applied to the surface of the cleaning layer in order to protect the surface of the cleaning layer. This brings about an effect that unintended particles which may be present on the surface of the cleaning layer can be removed when this removable sheet is stripped off.

The invention further provides: a cleaning sheet which comprises a sheet material having a porous layer and, formed on one side of the sheet material, a pressure-sensitive adhesive layer (embodiment 2); a cleaning sheet which comprises a base material and a porous layer formed as a cleaning layer on one side of the base material (embodiment 3); and a cleaning sheet which comprises a base material, a porous layer formed as a cleaning layer on one side of the base material, and a pressure-sensitive adhesive layer formed on the other side of the base material (embodiment 4). This pressure-sensitive adhesive layer is not particularly limited in material, etc., as long as it satisfies the pressure-sensitive adhesive function. An ordinary pressure-sensitive adhesive (e.g., an acrylic or rubber-based one or the like) can be used. As this pressure-sensitive adhesive layer can also be used a double-faced pressure-sensitive adhesive tape.

The cleaning sheet having such constitution can be applied through the pressure-sensitive adhesive layer to a transfer member, such as various substrates and tapes or sheets, to give a transfer member having a cleaning function (embodiment 7). By conveying this transfer member having a cleaning function into an apparatus and bringing it into contact with the part to be cleaned, this part can be cleaned (embodiment 9). As another embodiment of the invention, a transfer member having a cleaning function, which comprises a transfer member and a porous layer formed as a cleaning layer on one side of the transfer member is provided. In this embodiment, the cleaning layer is provided on at least one side of the transfer member.

In the case where the transfer member, such as substrate, is to be peeled from the pressure-sensitive adhesive layer so as to reuse the substrate, this pressure-sensitive adhesive layer preferably has a tackiness, in terms of the strength of 180° peeling from a silicon wafer (mirror surface), of about from 0.01 to 10 N/10 mm, especially about from 0.10 to 5 N/10 mm. This is because as long as the pressure-sensitive adhesive layer has such a tackiness, the transfer member does not peel off during conveyance and can be easily separated after the cleaning.

The cleaning sheet may be one comprising a base material and the cleaning layer formed thereon. This base material is not particularly limited. Examples thereof include films of plastics such as polyethylene, poly(ethylene terephthalate), acetyl cellulose, polycarbonates, polypropylene, polyamides, polyimides, and polycarbodiimides. The thickness thereof is generally about from 10 to 100 μm.

The transfer member to which the cleaning sheet is applied is not particularly limited. Examples thereof include semiconductor wafers, substrates for flat panel displays such as LCDs and PDPs, and substrates for compact disks, MR heads, and the like.

The invention further more provides: the transfer member having a cleaning function, characterized in that the cleaning sheet has a smaller shape than the transfer member and does not protrude from the edges of the transfer member (embodiment 8); and a cleaning label sheet for use therein.

Processes for producing the transfer member having a cleaning function described above are not particularly limited. In the case where a cleaning sheet is applied to a transfer member such as, e.g., a substrate, to produce a transfer member for cleaning, examples of production processes include: a method in which a cleaning sheet larger than the transfer member is applied and then cut along the contour of the member (hereinafter referred to as direct cut method); and a method in which a label sheet for cleaning which has been cut into the shape of the transfer member beforehand is applied to the transfer member to produce a transfer member for cleaning (hereinafter referred to as precut method). However, the precut method is preferred because in the direct cut method, there is a possibility that a cutting dust might generate from the cleaning layer or the like during the sheet cutting and adhere to the transfer member for cleaning or to the apparatus. In this precut method, the generation of a cutting dust during sheet cutting is more inhibited than in the direct cut method. However, when the cleaning label sheet applied reaches to an edge of the transfer member, that part of the label sheet which is located at the edge may be caught in a transfer member cassette or on the conveyance path according to the kind of the conveying device. There is hence a possibility that the label sheet might suffer lifting or shifting, making the conveyance impossible in the worst case.

Consequently, the transfer member having a cleaning function of the invention is preferably one in which the cleaning sheet has a smaller shape than the transfer member and does not protrude from the edges of the transfer member. In case where the cleaning sheet is larger than the shape of the transfer member and protrudes from an edge of the transfer member, there is the possibility that the protruding part of the cleaning sheet might be caught in a transfer member cassette or on the conveyance path and the label sheet might suffer lifting or shifting, making the conveyance impossible in the worst case. The problem that the cleaning sheet is caught by a transfer member cassette may arise even in the case where the cleaning sheet has the same shape as the transfer member. The degree of smallness is not particularly limited. From a practical standpoint, however, the cleaning sheet is desirably smaller by up to about 5 mm, because too small a cleaning sheet size results in a decrease in the effective area for removing particles which is important.

EXAMPLES

The invention will be explained below based on Examples, but the invention should not be construed as being limited thereto. Hereinafter, all parts are by weight.

Example 1

A hundred parts of an acrylic polymer (weight-average molecular weight, 700,000) obtained from a monomer mixture consisting of 75 parts of 2-ethylhexyl acrylate, 20 parts of methyl acrylate, and parts of acrylic acid was evenly mixed with 50 parts of a urethane acrylate and 3 parts of diphenylmethane diisocyanate to prepare an ordinary pressure-sensitive adhesive solution.

This solution was applied to one side of a porous film of ultrahigh-molecular weight polyethylene having a width of 250 mm, thickness of 25 µm, and pore diameter of from 0.05 to 2 µm (Solupor, manufactured by Teijin Ltd.) in a thickness of 10 µm on a dry basis to form an ordinary pressure-sensitive adhesive layer. To the surface thereof was applied a polyester release film having a thickness of 38 µm. Thus, a cleaning sheet of the invention was obtained.

The surface of this cleaning layer had substantially no tackiness. The porosity of this cleaning layer was from 40 to 90%. The cleaning layer was applied in a width of 10 mm to the mirror surface of a silicon wafer and the tackiness thereof in terms of the strength of 180° peeling from the silicon wafer was measured in accordance with JIS Z0237. As a result, the tackiness was 0.0009 N (0.1 g)/10 mm. The cleaning layer was thus ascertained to have substantially no tackiness.

Furthermore, the pressure-sensitive adhesive layer formed on the other side was applied in a width of 10 mm to the mirror surface of a silicon wafer and the tackiness thereof in terms of the strength of 180° peeling from the silicon wafer was measured in accordance with JIS Z0237. As a result, the tackiness was 2.8 N/10 mm.

The release film on the ordinary pressure-sensitive adhesive layer of this cleaning sheet was stripped off, and the sheet was applied to the back side (mirror surface) of an 8-inch silicon wafer with a hand roller. Thus, a cleaning wafer for transfer (1) having a cleaning function was produced.

On the other hand, the mirror surface of each of two new 8-inch silicon wafers was examined with a laser contamination detector for particles of 0.2 µm or larger. As a result, the number of particles on the first wafer was 8 and that on the second was 12. These wafers were conveyed into separate substrate-processing apparatus while keeping the mirror surface facing downward, and then the mirror surface of each wafer was examined with the laser contamination detector. As a result, the number of particles on the first wafer as counted in the 8-inch wafer size area was 27,890 and that on the second was 27,003.

Subsequently, the release film on the cleaning layer side of the cleaning wafer for transfer (1) obtained above was stripped off, and this cleaning wafer (1) was conveyed into the substrate-processing apparatus having the wafer stage which had resulted in the number of adherent particles of 27,890. As a result, the cleaning wafer (1) could be conveyed without arousing any trouble. Thereafter, a new 8-inch silicon wafer in which the number of adherent particles of 0.2 µm or larger was 7 was conveyed while keeping the mirror surface facing downward, and then examined with the laser contamination detector for particles of 0.2 µm or larger. As a result, the number of particles as counted in the 8-inch wafer size area was 4,200. Thus, 85% by number of the particles which had been adherent before the cleaning could be removed.

Comparative Example 1

A cleaning sheet was produced in the same manner as in Example 1, except that a nonporous film of ultrahigh-molecular weight polyethylene was used. A cleaning wafer for transfer (2) produced from this cleaning sheet in the same manner as in Example 1 was conveyed through the substrate-processing apparatus having the wafer stage which had resulted in the number of adherent particles of 27,003. As a result, the cleaning wafer (2) could be conveyed without arousing any trouble. Thereafter, a new 8-inch silicon wafer in which the number of adherent particles of 0.2 µm or larger was 9 was conveyed while keeping the mirror surface facing downward, and then examined with the laser contamination detector for particles of 0.2 µm or larger. As a result, the number of particles as counted in the 8-inch wafer size area was 13,000. Thus, only 48% by number of the particles which had been adherent before the cleaning could be removed.

Example 2

A hundred parts of an acrylic polymer (weight-average molecular weight, 700,000) obtained from a monomer mixture consisting of 75 parts of 2-ethylhexyl acrylate, 20 parts of methyl acrylate, and 5 parts of acrylic acid was evenly mixed with 10 parts of polyethylene glycol 200 dimethacrylate (trade name, Nk Ester 4G; manufactured by Shin-Nakamura Chemical Co., Ltd.) and 3 parts of a polyisocyanate compound (trade name, Coronate L; manufactured by Nippon Polyurethane Co., Ltd.) to obtain a pressure-sensitive adhesive solution A.

A release film consisting of a continuous polyester film (thickness, 38 µm; width, 250 mm) treated on one side with a silicone release agent was coated, on the treated side, with the pressure-sensitive adhesive solution A in a thickness of 10 µm on a dry basis. On the resultant pressure-sensitive adhesive layer was superposed an ultrahigh-molecular weight porous film (Sunmap, manufactured by Nitto Denko Corp.; thickness, 80 μm; width 250 mm). A removable pressure-sensitive adhesive sheet was further applied to the porous film. Thus, a cleaning sheet A was obtained in which the porous film of ultrahigh-molecular weight polyethylene served as a cleaning layer.

The laminate film which was that part of the cleaning sheet A which excluded the release film on the pressure-sensitive adhesive side was punched in circles having a diameter of 198 mm. The unnecessary part of the film was continuously stripped off to produce label sheets for cleaning A accordance to the invention.

The release film on the pressure-sensitive adhesive layer side of one of these label sheets for cleaning A was stripped off, and the sheet was applied to the back side (mirror surface) of an 8-inch silicon wafer with a hand roller. Thus, a cleaning wafer for transfer having a cleaning function was produced. The ordinary pressure-sensitive adhesive layer thereof had a thickness of 5 N/10 mm in terms of the strength of 180° peeling from a silicon wafer (mirror surface).

Label sheets for cleaning A were applied to 8-inch silicon wafers with a label tape applicator (NEL-GR3000, manufactured by Nitto Seiki). Each sheet A was applied to the back side (mirror surface) of an 8-inch silicon wafer. This operation was successively conducted for twenty-five wafers. As a result, the sheet application to wafers could be carried out without arousing any trouble. Thus, cleaning wafers for transfer A having a cleaning function were produced. These cleaning wafers for transfer A having a cleaning function were inspected. As a result, the label sheet applied to each silicon wafer was ascertained to be within the contour of the wafer.

On the other hand, the mirror surface of each of two new 8-inch silicon wafers was examined with a laser contamination detector for particles of 0.2 μm or larger. As a result, the number of particles on the first wafer was 6 and that on the second was 5. These wafers were conveyed into separate substrate-processing apparatus having a static holding mechanism, while keeping the mirror surface facing downward, and then examined with the laser contamination detector for particles of 0.2 μm or larger. As a result, the number of particles on the first wafer as counted in the 8-inch wafer size area was 33,456 and that on the second was 36,091.

Subsequently, the removable film on the cleaning layer side of one of the cleaning wafers for transfer A obtained above was stripped off, and this cleaning wafer A was conveyed into the substrate-processing apparatus having the wafer stage which had resulted in the number of particles of 33,456. As a result, the cleaning wafer A could be conveyed without arousing any trouble. Thereafter, a new 8-inch silicon wafer was conveyed while keeping the mirror surface downward, and then examined with the laser contamination detector for particles of 0.2 μm or larger. This operation was conducted five times. The results thereof are shown in Table 1.

TABLE 1

| | Degree of removal of particles | | | | |
|---|---|---|---|---|---|
| | One-wafer conveyance | Two-wafer conveyance | Three-wafer conveyance | Four-wafer conveyance | Five-wafer conveyance |
| Example 2 | 80% | 88% | 90% | 92% | 92% |

The examination surfaces of the 8-inch silicon wafers used in the examination were examined by XPS. As a result, no siloxane was detected of course and the proportions of other elements were almost the same as in clean silicon wafers.

While the invention has been described in detail and with reference to specific embodiments thereof, it will be apparent to one skilled in the art that various changes and modifications can be made therein without departing from the spirit and scope thereof.

INDUSTRIAL APPLICABILITY

As described above, the cleaning sheets and transfer member having a cleaning function of the invention can be conveyed through substrate-processing apparatus without fail, and particles adherent to inner parts of the apparatus can be easily removed therewith without fail.

The invention claimed is:

1. A cleaning sheet which consists of a base material, a porous layer formed as a cleaning layer on one side of the base material, and an adhesive layer formed on the other side of the base material, wherein the porous layer is a plastic film and has a thickness of 5 to 500 μm.

2. The cleaning sheet according to claim 1, wherein the porous layer is a film of ultrahigh-molecular weight polyethylene.

3. A cleaning member comprising a transfer member and the cleaning sheet according to claim 1 provided thereto through the adhesive layer.

4. The cleaning member according to claim 3, wherein the cleaning sheet has a smaller shape than that of the transfer member and does not protrude from the edges of the transfer member.

5. The cleaning member according to claim 4, wherein the porous layer is a film of ultrahigh-molecular weight polyethylene.

6. The cleaning member according to claim 4, wherein the porous layer contains a heat-resistant polymeric resin.

7. A method of cleaning a substrate-processing apparatus, which comprises conveying the cleaning sheet according to claim 1 into contact with a part to be cleaned.

8. The cleaning sheet according to claim 1, wherein the porous layer has pores and the diameter of the pores is 0.1 to 100 μm.

9. The cleaning sheet according to claim 1, wherein the porous layer contains polyethylene, polypropylene, polyester, polyurethane, or a heat-resistant polymeric resin.

10. The cleaning sheet according to claim 9, wherein the heat-resistant polymeric resin is polycarbodiimide, polyimide, heat-resistant acrylic resin, fluororesin, or polyester resin.

11. The cleaning sheet according to claim 10, wherein the polycarboiimide has a structural unit represented by the following formula (1):

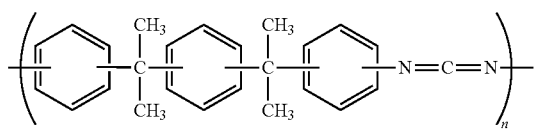

(1)

(wherein n is an integer of 2 to 300).

* * * * *